United States Patent
Lieberer et al.

(10) Patent No.: US 12,027,427 B2
(45) Date of Patent: Jul. 2, 2024

(54) PREHEAT PROCESSES FOR MILLISECOND ANNEAL SYSTEM

(71) Applicants: Mattson Technology, Inc., Fremont, CA (US); Beijing E-Town Semiconductor Technology Co., Ltd., Beijing (CN)

(72) Inventors: Markus Lieberer, Augsburg (DE); Christian Pfahler, Ulm (DE); Markus Hagedorn, Ulm (DE); Michael vanAbbema, Ulm (DE); Alexandr Cosceev, Lonsee (DE)

(73) Assignees: Mattson Technology, Inc., Fremont, CA (US); Beijing E-Town Semiconductor Technology Co., Ltd., Beijing (CN)

( * ) Notice: Subject to any disclaimer, the term of this patent is extended or adjusted under 35 U.S.C. 154(b) by 0 days.

(21) Appl. No.: 16/936,468

(22) Filed: Jul. 23, 2020

(65) Prior Publication Data
US 2020/0350217 A1 Nov. 5, 2020

Related U.S. Application Data

(62) Division of application No. 15/377,121, filed on Dec. 13, 2016, now Pat. No. 10,727,140.
(Continued)

(51) Int. Cl.
*H01L 21/67* (2006.01)
*H01L 21/324* (2006.01)
(Continued)

(52) U.S. Cl.
CPC ............ *H01L 22/20* (2013.01); *H01L 21/324* (2013.01); *H01L 21/67115* (2013.01);
(Continued)

(58) Field of Classification Search
CPC ............ H01L 21/324; H01L 21/67115; H01L 21/67248; H01L 21/68757; H01L 21/00;
(Continued)

(56) References Cited

U.S. PATENT DOCUMENTS 6,179,466 B1   1/2001 Peuse
6,204,203 B1   3/2001 Narwankar et al.
(Continued)

FOREIGN PATENT DOCUMENTS

JP   2001127057   5/2001
JP   2002261040   9/2002
(Continued)

OTHER PUBLICATIONS

Ragnarsson et al., "The Importance of Moisture Control for EOT Scaling of Hf-Based Dielectrics," *Journal of the Electrochemical Society*, vol. 156, Issue 6, Apr. 3, 2009, pp. H416-H423.
(Continued)

*Primary Examiner* — Timor Karimy
(74) *Attorney, Agent, or Firm* — Dority & Manning, P.A.

(57) ABSTRACT

Preheat processes for a millisecond anneal system are provided. In one example implementation, a preheat process can include receiving a substrate on a wafer support plate in a processing chamber of a millisecond anneal system; obtaining one or more temperature measurements of the wafer support plate using a temperature sensor; and applying a preheat recipe to heat the wafer support plate based at least in part on the temperature of the wafer support plate. In one example implementation, a preheat process can include obtaining one or more temperature measurements from a temperature sensor having a field of view of a wafer support plate in a millisecond anneal system; and applying a pulsed preheat recipe to heat the wafer support plate in the milli-
(Continued)

second anneal system based at least in part on the one or more temperature measurements.

10 Claims, 16 Drawing Sheets

Related U.S. Application Data

(60) Provisional application No. 62/272,811, filed on Dec. 30, 2015.

(51) Int. Cl.
    *H01L 21/66*     (2006.01)
    *H01L 21/687*     (2006.01)

(52) U.S. Cl.
    CPC .... *H01L 21/6719* (2013.01); *H01L 21/67248* (2013.01); *H01L 21/68757* (2013.01)

(58) Field of Classification Search
    CPC ........... H01L 21/6753; H01L 21/67276; H01L 22/20; H01L 22/12; H01L 22/26
    See application file for complete search history.

(56) References Cited

U.S. PATENT DOCUMENTS

| | | | |
|---|---|---|---|
| 6,467,297 B1 * | 10/2002 | Bollinger | H01L 21/223 |
| | | | 156/345.1 |
| 7,127,367 B2 | 10/2006 | Ramachandran et al. | |
| 7,371,998 B2 | 5/2008 | Harris | |
| 7,442,415 B2 | 10/2008 | Conley, Jr. et al. | |
| 7,790,633 B1 | 9/2010 | Tarafdar et al. | |
| 8,323,754 B2 | 12/2012 | Olsen et al. | |
| 8,809,175 B2 | 8/2014 | Tsai et al. | |
| 9,093,468 B2 | 7/2015 | Tsai et al. | |
| 9,386,632 B2 | 7/2016 | Ji | |
| 9,482,468 B2 | 11/2016 | Camm et al. | |
| 2005/0063453 A1 | 3/2005 | Camm et al. | |
| 2005/0274709 A1 | 12/2005 | Kusuda | |
| 2010/0074604 A1 * | 3/2010 | Koelmel | H01L 21/67098 |
| | | | 392/416 |
| 2010/0111513 A1 | 5/2010 | Nishihara | |
| 2010/0124248 A1 | 5/2010 | Patalay et al. | |
| 2012/0201267 A1 | 8/2012 | Patalay | |
| 2012/0208377 A1 * | 8/2012 | Timans | H01L 21/67115 |
| | | | 438/799 |
| 2013/0109109 A1 | 5/2013 | Shibagaki et al. | |
| 2013/0259457 A1 | 10/2013 | Yokouchi et al. | |
| 2013/0306871 A1 * | 11/2013 | Cibere | H01L 21/67248 |
| | | | 250/340 |
| 2015/0140838 A1 | 5/2015 | Kashefi et al. | |
| 2015/0181649 A1 * | 6/2015 | Ji | H05B 3/0047 |
| | | | 219/502 |

FOREIGN PATENT DOCUMENTS

| | | |
|---|---|---|
| JP | 2005515425 A | 5/2005 |
| JP | 2006135126 | 5/2006 |
| JP | 2010225613 | 10/2010 |
| JP | 2012509575 A | 10/2011 |
| WO | WO2005043696 | 5/2005 |

OTHER PUBLICATIONS

Ferrari et al., "Diffusion Reaction of Oxygen in HfO2/SiO2/Si Stacks," *The Journal of Physical Chemistry B*, vol. 110, No. 30, Jul. 12, 2006, pp. 14905-14910.

Driemeier et al., "Thermochemical behavior of hydrogen in hafnium silicate films on Si," Applied Physics Letters, vol. 89, Issue 5, Aug. 2006,—4 pages.

Driemeier et al., "Room temperature interactions of water vapor with Hf O2 films on Si," Applied Physics Letters, vol. 88, Issue 20, May 2006—3 pages.

Conley, Jr. et al., "Densification and improved electrical properties of pulse-deposited films via in situ modulated temperature annealing," *Applied Physics Letters*, vol. 84, Issue 11, Mar. 15, 2004, pp. 1913-1915.

Nakajima et al., "Experimental Demonstration of Higher-k phase HfO2 through Non-equilibrium Thermal Treatment," ECS Transactions 28.2 (2010), pp. 203-212.

Wu et al., "Device Performance and Reliability Improvement for MOSFETs With HfO2 Gate Dielectrics Fabricated Using Multideposition Room-Temperature Multiannealing," IEEE Electron Device Letters, vol. 32, Issue 9, Sep. 2011, pp. 1173-1175.

The core of the IoT-conquered by smart sensors—Temperature and humidity sensor—"Basics of Infrared Thermometer," Mar. 15, 2015, Author Unknown, English translation: https://m.blog.naver.com/PostView.nhn?blogId=iotsensor&logNo=220299069924&proxyReferer=https %3A%2F%2Fwww.google.com%2F—7pages.

PCT International Search Report for corresponding PCT Application No. PCT/US2016/066341, mailed on Mar. 31, 2017, 3 pages.

PCT International Preliminary Report on Patentability for corresponding PCT Application No. PCT/US2016/066341, mailed on Jul. 12, 2018—13 pages.

* cited by examiner

PREHEAT PROCESSES FOR MILLISECOND ANNEAL SYSTEM

PRIORITY CLAIM

The present application is a divisional of U.S. application Ser. No. 15/377,121, filed on Dec. 13, 2016, titled "Preheat Processes for Millisecond Anneal System," which claims the benefit of priority of U.S. Provisional Application Ser. No. 62/272,811, filed on Dec. 30, 2015, titled "Pre-heat Processes for Millisecond Anneal System," which is incorporated herein by reference.

FIELD

The present disclosure relates generally to thermal processing chambers and more particularly to millisecond anneal thermal processing chambers used for processing substrates, such as semiconductor substrates.

BACKGROUND

Millisecond anneal systems can be used for semiconductor processing for the ultra-fast heat treatment of substrates, such as silicon wafers. In semiconductor processing, fast heat treatment can be used as an anneal step to repair implant damage, improve the quality of deposited layers, improve the quality of layer interfaces, to activate dopants, and to achieve other purposes, while at the same time controlling the diffusion of dopant species.

Millisecond, or ultra-fast, temperature treatment of semiconductor substrates can be achieved using an intense and brief exposure of light to heat the entire top surface of the substrate at rates that can exceed $10^{4\circ}$ C. per second. The rapid heating of just one surface of the substrate can produce a large temperature gradient through the thickness of the substrate, while the bulk of the substrate maintains the temperature before the light exposure. The bulk of the substrate therefore acts as a heat sink resulting in fast cooling rates of the top surface.

SUMMARY

Aspects and advantages of embodiments of the present disclosure will be set forth in part in the following description, or may be learned from the description, or may be learned through practice of the embodiments.

One example aspect of the present disclosure is to a preheat process for a millisecond anneal system. The preheat process includes receiving a substrate on a wafer support plate in a processing chamber of a millisecond anneal system. The processing chamber is divided into a top chamber and a bottom chamber. The process includes obtaining one or more temperature measurements of the wafer support plate using a temperature sensor. The process includes apply a preheat recipe to heat the wafer support plate based at least in part on the one or more temperature measurements of the wafer support plate.

Another example aspect of the present disclosure is directed to a temperature measurement system for a millisecond anneal system. The temperature measurement system includes a far infrared temperature sensor configured to obtain one or more temperature measurements of a semiconductor substrate in a millisecond anneal system at process temperatures of less than about 450° C. The millisecond anneal system can include a processing chamber having a wafer plane plate. The wafer plane plate can divide the processing chamber into a top chamber and a bottom chamber. The temperature measurement system can include a processing circuit configured to process measurements from the temperature sensor to determine a temperature of the semiconductor substrate at temperatures of less than about 450° C.

Yet another example aspect of the present disclosure is directed to a preheat process for a millisecond anneal system. The preheat process includes obtaining one or more temperature measurements from a temperature sensor having a field of view of a wafer support plate in a millisecond anneal system. The millisecond anneal system has a processing chamber divided into a top processing chamber and a bottom processing chamber. The process includes applying a pulsed preheat recipe to heat the wafer support plate in the millisecond anneal system based at least in part on the one or more temperature measurements. There is no substrate located on the wafer support plate during application of the pulsed heat recipe.

Variations and modification can be made to the example aspects of the present disclosure.

Other example aspects of the present disclosure are directed to systems, methods, devices, and processes for thermally treating a semiconductor substrate.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
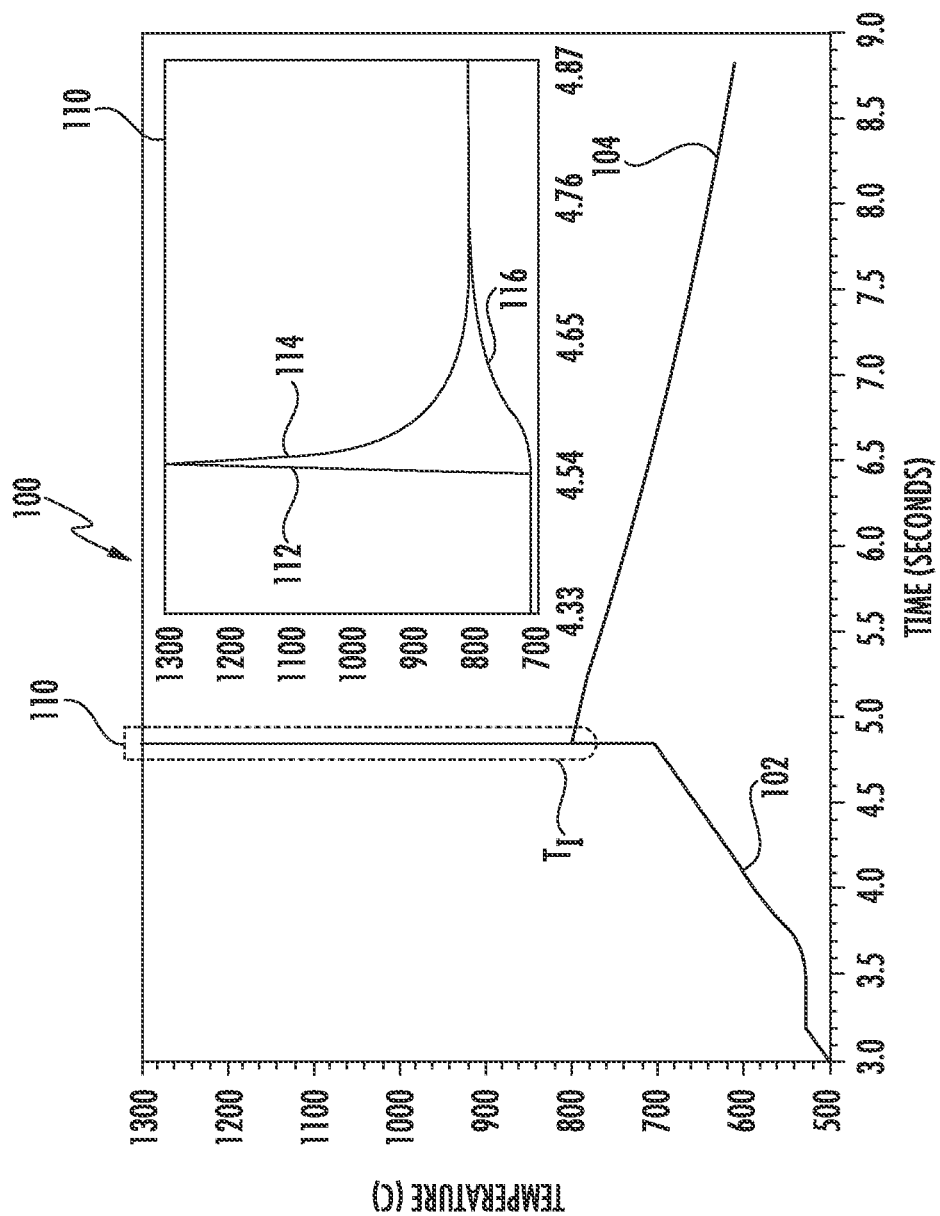
FIG. 1 depicts an example millisecond anneal heating profile according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Overview

Example aspects of the present disclosure are directed to preheating processes for a millisecond anneal system to reduce first substrate (e.g., a silicon wafer) effects during millisecond thermal treatment of a substrate. Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any workpiece, semiconductor substrate or other suitable substrate. In addition, use of the term "about" in conjunction with a numerical value is intended to refer to within 10% of the stated numerical value.

Millisecond, or ultra-fast, thermal treatment of semiconductor wafers can be achieved using an intense and brief exposure of light (e.g., a "flash") to heat the entire top surface of the wafer at rates that can exceed $10^{4\circ}$ C. per second. A typical heat treatment cycle can include: (a) loading a cold semiconductor substrate into the chamber; (b) purging the chamber with, for instance, nitrogen gas (atmospheric pressure); (c) heating the semiconductor substrate to an intermediate temperature $T_i$; (d) millisecond heating by flash exposure of the top surface of the semiconductor substrate, while the bulk of the wafer remains at $T_i$; (e) rapid cool down by conductive cooling of the top surface of the semiconductor substrate with the bulk of the semiconductor substrate being the conductively coupled heat sink; (f) slow cool down of the bulk of the semiconductor substrate by thermal radiation and convection, with the process gas at atmospheric pressure as cooling agent; and (g) transport the semiconductor substrate back to the cassette.

The exact parameters of the processing steps in a heat treatment cycle (e.g., duration, temperature set-point, heating rate, etc.) can be prescribed in a process recipe. The process recipe can be editable and can be modified by a user. The recipe can be executed by one or more electronic system controllers at run time. The controller(s) can include one or more processors and one or memory devices. The memory devices can store the recipes as computer-readable instructions that when executed by the one or more processors cause the controller(s) to implement the recipe.

The system can have a number of pre-defined recipes stored in the one or more memory devices. The type of application or heat treatment can determine which recipe is executed. Semiconductor substrates can be loaded onto the system by way of a FOUP (Front Opening Unified Pods) containing a cassette holding, for instance, twenty-five semiconductor substrates or other suitable input mechanism. An entity of twenty five semiconductor substrates can constitute a "batch", or a "lot" of semiconductor substrates. Typically a lot is processed with the same process recipe. If there is no break between processing lots with the same recipe, the system can be said to be running in a continuous mode.

As discussed in detail below, the process chamber in which such a treatment cycle is carried out can include: (1) a wafer support plate made out of, for instance, quartz glass; (2) chamber walls made out of high reflective, water cooled aluminum plates; (3) top and bottom water windows transparent for the heating light, made out of water cooled quartz plates. Except for the wafer support plate, all components of the chamber can be actively cooled and can remain at constant temperature throughout the thermal treatment of the semiconductor substrate. The wafer support plate, in some embodiments, is not actively cooled.

When starting with a cold system, each heat treatment cycle heats the wafer support plate when the semiconductor substrate is heated and cools it during the cool down phase of the cycle. As the heating phase is typically more dominant than the cooling phase, the average temperature of the plate is increasing with each cycle until it reaches an equilibrium temperature. Until the equilibrium temperature is reached, every semiconductor substrate undergoing heat treatment sees a different thermal radiation background, affecting the thermal budget of the treatment process and therefore the process result. In order to achieve good repeatability, a cold process chamber may need to be preheated to the equilibrium temperature. This can be accomplished by executing the process recipe on a number of preheat dummy wafers. For instance six preheat dummy wafers can be used for this purpose and can be run before the first lot is being processed. When the system is running in continuous mode, no preheat dummy wafers are needed, as the wafer support plate is automatically staying at equilibrium temperature.

A downside of dummy-wafers is that preheat dummy wafers are required and the preheat cycle takes up a considerable amount of processing time. This can be especially true when the system cannot be kept running in continuous mode or a variety of applications have to be run, each requiring a different equilibrium temperature of the wafer support plate. As a result, preheat dummy wafers may have to be run in between lots.

Example aspects of the present disclosure are directed to reducing preheat processing time and/or reducing the number of dummy wafers to preheat the processing chamber to an equilibrium temperature. In this way, the efficiency of operation of the millisecond anneal system can be improved.

For example, one example embodiment is directed to a preheat process for a millisecond anneal system. The process can include receiving a substrate on a wafer support plate in a processing chamber of a millisecond anneal system. The processing chamber can be divided into a top chamber and a bottom chamber. The process can include obtaining one or more temperature measurements of the wafer support plate using a temperature sensor; and applying a preheat recipe to heat the wafer support plate based at least in part on the one or more temperature measurements of the wafer support plate.

Variations and modifications can be made to this example embodiment. For instance, in some embodiments, the wafer support plate can be a quartz material. In some embodiments, the substrate can include a dummy semiconductor substrate.

In some embodiments, applying a preheat recipe to heat the wafer support plate based at least in part on the one or more temperature measurements of the wafer support plate can include applying the preheat recipe to heat the wafer support plate until the temperature of the wafer support plate reaches a pre-set temperature. When the wafer support plate reaches the pre-set temperature, the process can include: stopping the preheat recipe; and applying a process recipe to a second substrate in the processing chamber. The process recipe is different than the preheat recipe.

In some embodiments, the preheat recipe specifies heating the wafer support plate and the substrate using one or more continuous mode lamps located proximate to the bottom processing chamber in the millisecond anneal system. The one or more continuous mode lamps are controlled based at least in part on the one or more temperature measurements of the wafer support plate.

In some embodiments, the temperature sensor can include a pyrometer having a measurement temperature associated with wavelengths greater than about 4 μm. In some embodiments, the temperature sensor is located in the bottom chamber and has a field of view of the wafer support plate without obstruction by a water window of the millisecond anneal system.

Another example embodiment of the present disclosure is directed to a temperature measurement system for a millisecond anneal system. The temperature measurement system can include a far infrared temperature sensor configured to obtain one or more temperature measurements of a semiconductor substrate in a millisecond anneal system at process temperatures of less than about 450° C., such as less than about 300° C., such as less than about 250° C. The millisecond anneal system can include a processing chamber having a wafer plane plate. The wafer plane plate can divide the processing chamber into a top chamber and a bottom chamber. The temperature measurement system can include a processing circuit configured to process measurements from the temperature sensor to determine a temperature of the semiconductor substrate at temperatures of less than about 450° C., such as less than about 300° C., such as less than about 250° C.

In some embodiments, the far infrared temperature sensor includes a pyrometer associated with a spectral range of about 8 μm to about 14 μm. In some embodiments, the far infrared temperature sensor is mounted in a corner of the top chamber of a millisecond anneal system. The far infrared temperature sensor can be unobstructed by a water window of the millisecond anneal system.

In some embodiments, the temperature measurement system further includes a second temperature sensor configured to measure a temperature of a wafer support plate in the millisecond anneal system. The second temperature sensor can be located in the bottom processing chamber and having a field of view of the wafer support plate.

Another example embodiment of the present disclosure is directed to a preheat process for a millisecond anneal system. The preheat process can include obtaining one or more temperature measurements from a temperature sensor having a field of view of a wafer support plate in a millisecond anneal system. The millisecond anneal system can have a processing chamber divided into a top processing chamber and a bottom processing chamber. The process includes applying a pulsed preheat recipe to heat the wafer support plate in the millisecond anneal system based at least in part on the one or more temperature measurements. There is no substrate located on the wafer support plate during application of the pulsed heat recipe. In some embodiments, the wafer support plate is a quartz material.

In some embodiments, applying a pulsed preheat recipe to heat the wafer support plate based at least in part on the temperature of the wafer support plate comprises applying the preheat recipe to heat the wafer support plate until the temperature of the wafer support plate reaches a pre-set temperature. When the wafer support plate reaches the pre-set temperature, the process can include: stopping the preheat recipe; and applying a process recipe to a second substrate in the processing chamber. The process recipe is different than the preheat recipe.

In some embodiments, the pulsed preheat recipe can specify a plurality of pulses of heating light. In some embodiments, the temperature sensor can include a pyrometer having a measurement temperature associated with wavelengths greater than about 4 μm.

Example Millisecond Anneal Systems

An example millisecond anneal system can be configured to provide an intense and brief exposure of light to heat the top surface of a wafer at rates that can exceed, for instance, about $10^{4°}$ C./s. FIG. 1 depicts an example temperature profile 100 of a semiconductor substrate achieved using a millisecond anneal system. As shown in FIG. 1, the bulk of the semiconductor substrate (e.g., a silicon wafer) is heated to an intermediate temperature $T_i$ during a ramp phase 102. The intermediate temperature can be in the range of about 450° C. to about 900° C. When the intermediate temperature $T_i$ is reached, the top side of the semiconductor substrate can be exposed to a very short, intense flash of light resulting in heating rates of up to about $10^{4°}$ C./s. Window 110 illustrates the temperature profile of the semiconductor substrate during the short, intense flash of light. Curve 112 represents the rapid heating of the top surface of the semiconductor substrate during the flash exposure. Curve 116 depicts the temperature of the remainder or bulk of the semiconductor substrate during the flash exposure. Curve 114 represents the rapid cool down by conductive of cooling of the top surface of the semiconductor substrate by the bulk of the semiconductor substrate acting as a heat sink. The bulk of the semiconductor substrate acts as a heat sink generating high top side cooling rates for the substrate. Curve 104 represents the slow cool down of the bulk of the semiconductor substrate by thermal radiation and convection, with a process gas as a cooling agent.

An example millisecond anneal system can include a plurality of arc lamps (e.g., four Argon arc lamps) as light sources for intense millisecond long exposure of the top surface of the semiconductor substrate—the so called "flash." The flash can be applied to the semiconductor substrate when the substrate has been heated to an intermediate temperature (e.g., about 450° C. to about 900° C.). A plurality of continuous mode arc lamps (e.g., two Argon arc lamps) can be used to heat the semiconductor substrate to the intermediate temperature. In some embodiments, the heating of the semiconductor substrate to the intermediate temperature is accomplished through the bottom surface of the semiconductor substrate at a ramp rate which heats the entire bulk of the wafer.

Figure 2:
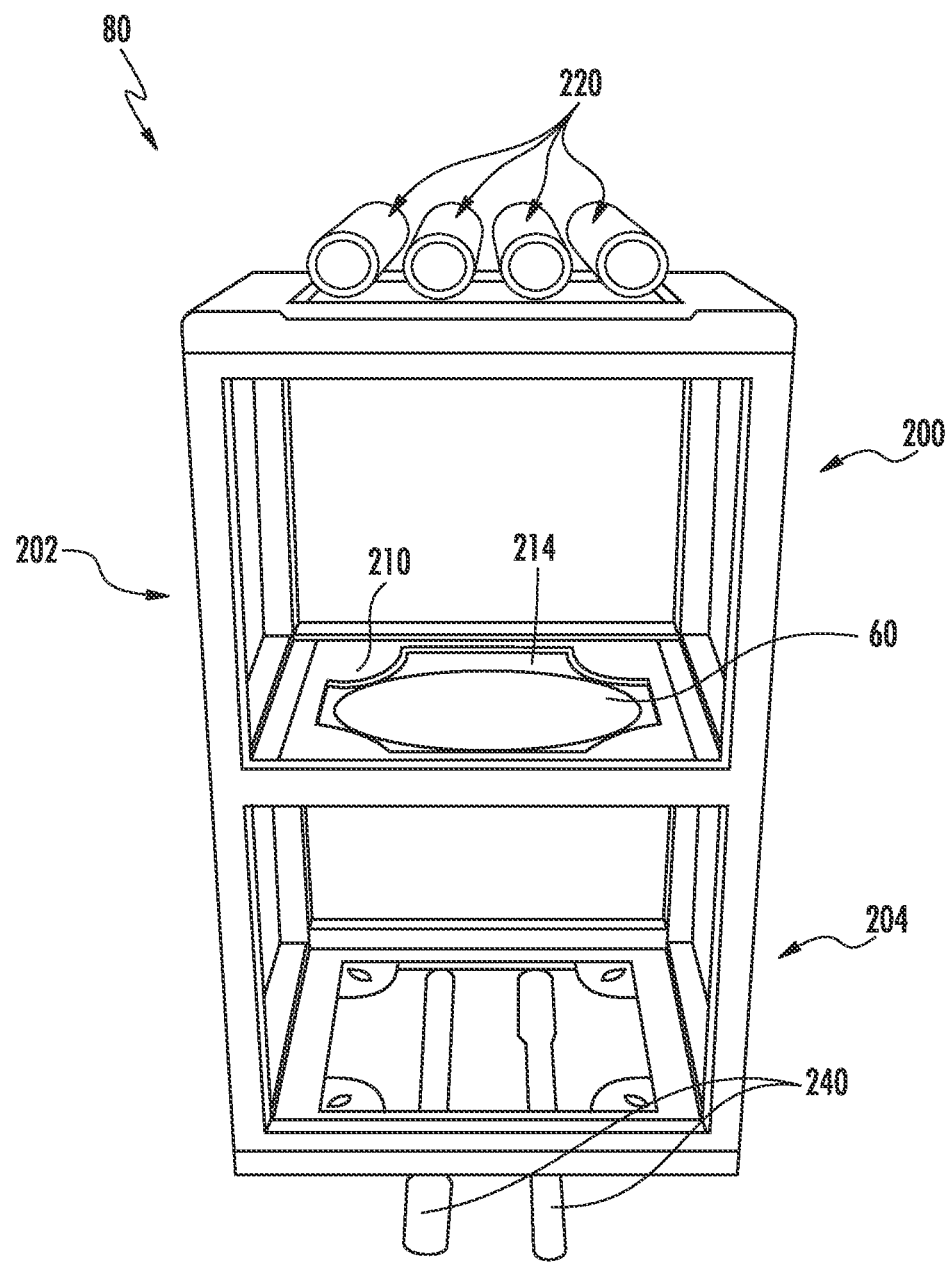
FIG. 2 depicts an example perspective view of a portion of an example millisecond anneal system according to example embodiments of the present disclosure.
Figure 3:
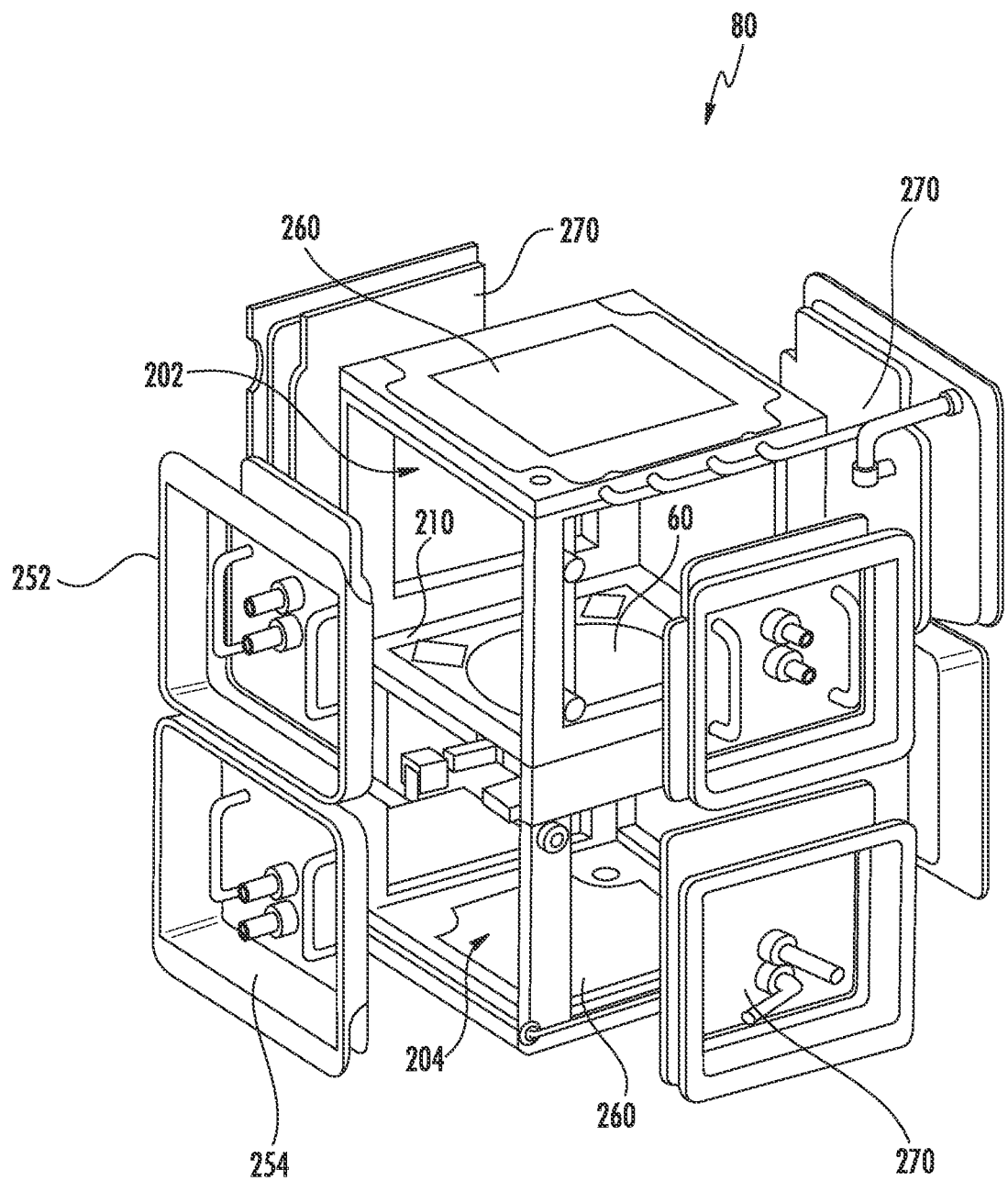
FIG. 3 depicts an exploded view of an example millisecond anneal system according to example embodiments of the present disclosure.
Figure 4:
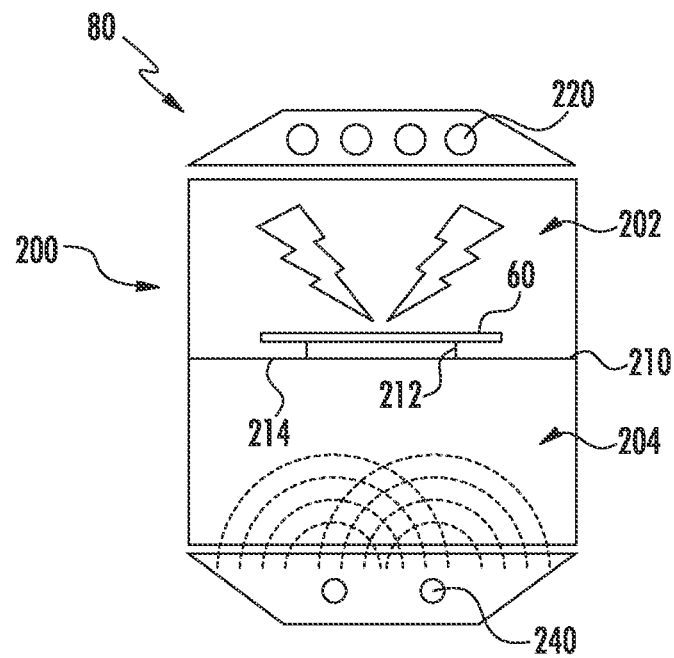
FIG. 4 depicts a cross-sectional view of an example millisecond anneal system according to example embodiments of the present disclosure.

FIGS. 2 to 5 depict various aspects of an example millisecond anneal system 80 according to example embodiments of the present disclosure. As shown in FIGS. 2-4, a millisecond anneal system 80 can include a process chamber 200. The process chamber 200 can be divided by a wafer plane plate 210 into a top chamber 202 and a bottom chamber 204. A semiconductor substrate 60 (e.g., a silicon wafer) can be supported by support pins 212 (e.g., quartz support pins) mounted to a wafer support plate 214 (e.g., quartz glass plate inserted into the wafer plane plate 210).

As shown in FIGS. 2 and 4, the millisecond anneal system 80 can include a plurality of arc lamps 220 (e.g., four Argon arc lamps) arranged proximate the top chamber 202 as light sources for intense millisecond long exposure of the top surface of the semiconductor substrate 60—the so called "flash." The flash can be applied to the semiconductor substrate when the substrate has been heated to an intermediate temperature (e.g., about 450° C. to about 900° C.).

A plurality of continuous mode arc lamps 240 (e.g., two Argon arc lamps) located proximate the bottom chamber 204 can be used to heat the semiconductor substrate 60 to the intermediate temperature. In some embodiments, the heating of the semiconductor substrate 60 to the intermediate temperature is accomplished from the bottom chamber 204 through the bottom surface of the semiconductor substrate at a ramp rate which heats the entire bulk of the semiconductor substrate 60.

As shown in FIG. 3, the light to heat the semiconductor substrate 60 from the bottom arc lamps 240 (e.g., for use in heating the semiconductor substrate to an intermediate temperature) and from the top arc lamps 220 (e.g., for use in providing millisecond heating by flash) can enter the processing chamber 200 through water windows 260 (e.g., water cooled quartz glass windows). In some embodiments, the water windows 260 can include a sandwich of two quartz glass panes between which an about a 4 mm thick layer of water is circulating to cool the quartz panes and to provide an optical filter for wavelengths, for instance, above about 1400 nm.

Figure 5:
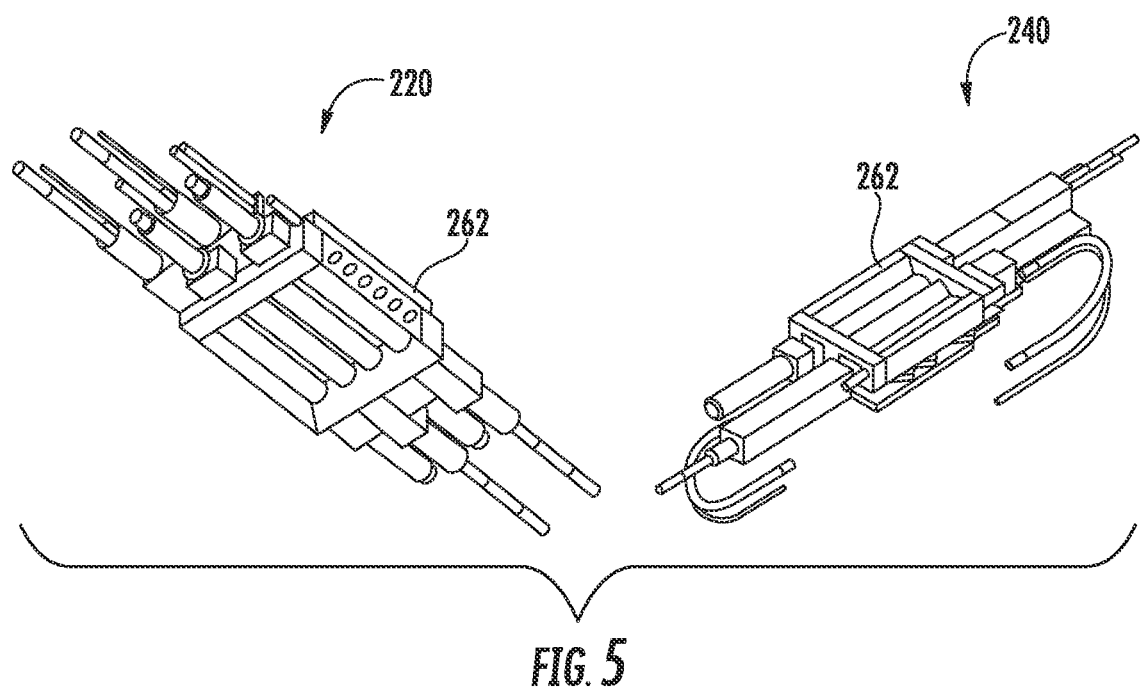
FIG. 5 depicts a perspective view of example lamps used in a millisecond anneal system according to example embodiments of the present disclosure.

As further illustrated in FIG. 3, process chamber walls 250 can include reflective mirrors 270 for reflecting the heating light. The reflective mirrors 270 can be, for instance, water cooled, polished aluminum panels. In some embodiments, the main body of the arc lamps used in the millisecond anneal system can include reflectors for lamp radiation. For instance, FIG. 5 depicts a perspective view of both a top lamp array 220 and a bottom lamp array 240 that can be used in the millisecond anneal system 200. As shown, the main body of each lamp array 220 and 240 can include a reflector 262 for reflecting the heating light. These reflectors 262 can form a part of the reflecting surfaces of the process chamber 200 of the millisecond anneal system 80.

The temperature uniformity of the semiconductor substrate can be controlled by manipulating the light density falling onto different regions of the semiconductor substrate. In some embodiments, uniformity tuning can be accomplished by altering the reflection grade of small size reflectors to the main reflectors and/or by use of edge reflectors mounted on the wafer support plane surrounding the wafer.

Figure 6:
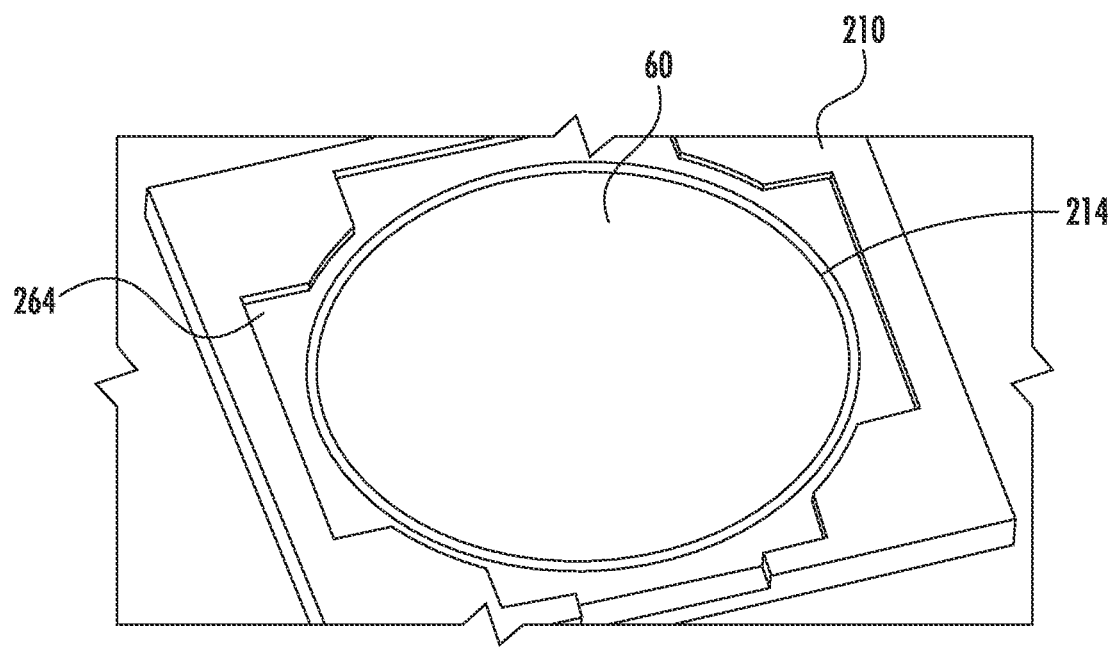
FIG. 6 depicts example edge reflectors used in a wafer plane plate of a millisecond anneal system according to example embodiments of the present disclosure.

For instance, edge reflectors can be used to redirect light from the bottom lamps 240 to an edge of the semiconductor substrate 60. As an example, FIG. 6 depicts example edge reflectors 264 that form a part of the wafer plane plate 210 that can be used to direct light from the bottom lamps 240 to the edge of the semiconductor substrate 60. The edge reflectors 264 can be mounted to the wafer plane plate 210 and can surround or at least partially surround the semiconductor substrate 60.

Figure 7:
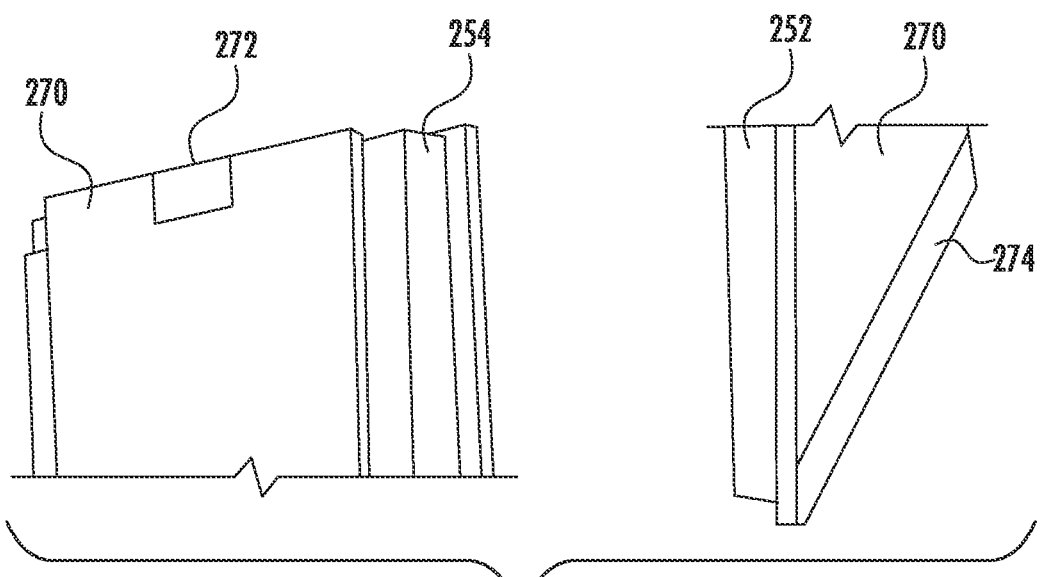
FIG. 7 depicts example reflectors that can be used in a millisecond anneal system according to example embodiments of the present disclosure.

In some embodiments, additional reflectors can also be mounted on chamber walls near the wafer plane plate 210. For example, FIG. 7 depicts example reflectors that can be mounted to the process chamber walls that can act as reflector mirrors for the heating light. More particularly, FIG. 7 shows an example wedge reflector 272 mounted to lower chamber wall 254. FIG. 7 also illustrates a reflective element 274 mounted to reflector 270 of an upper chamber wall 252. Uniformity of processing of the semiconductor substrate 60 can be tuned by changing the reflection grade of the wedge reflectors 272 and/or other reflective elements (e.g., reflective element 274) in the processing chamber 200.

Figure 8:
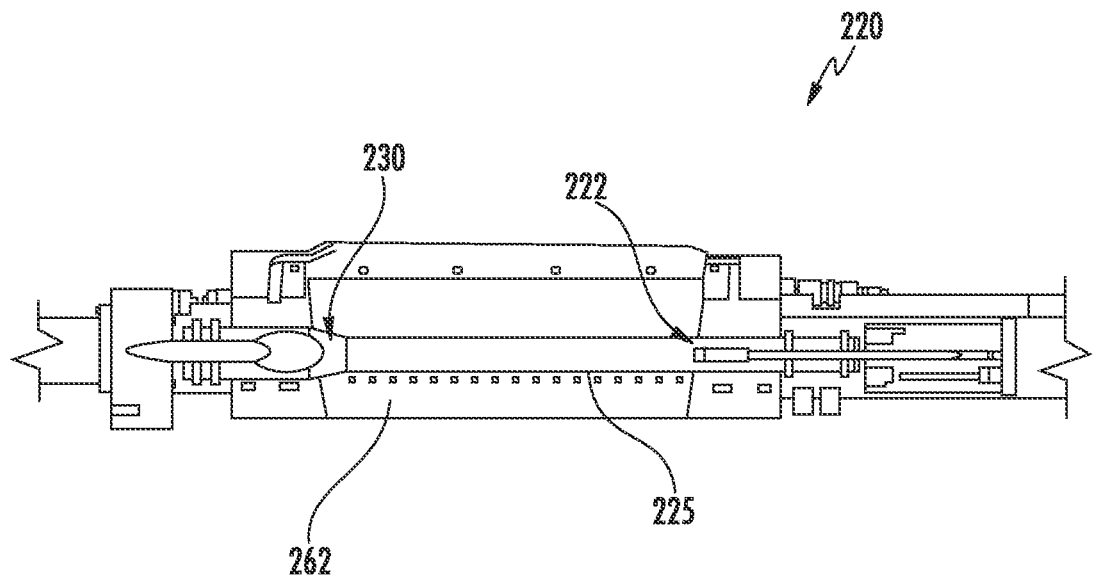
FIG. 8 depicts an example arc lamp that can be used in a millisecond anneal system according to example embodiments of the present disclosure.
Figure 9:
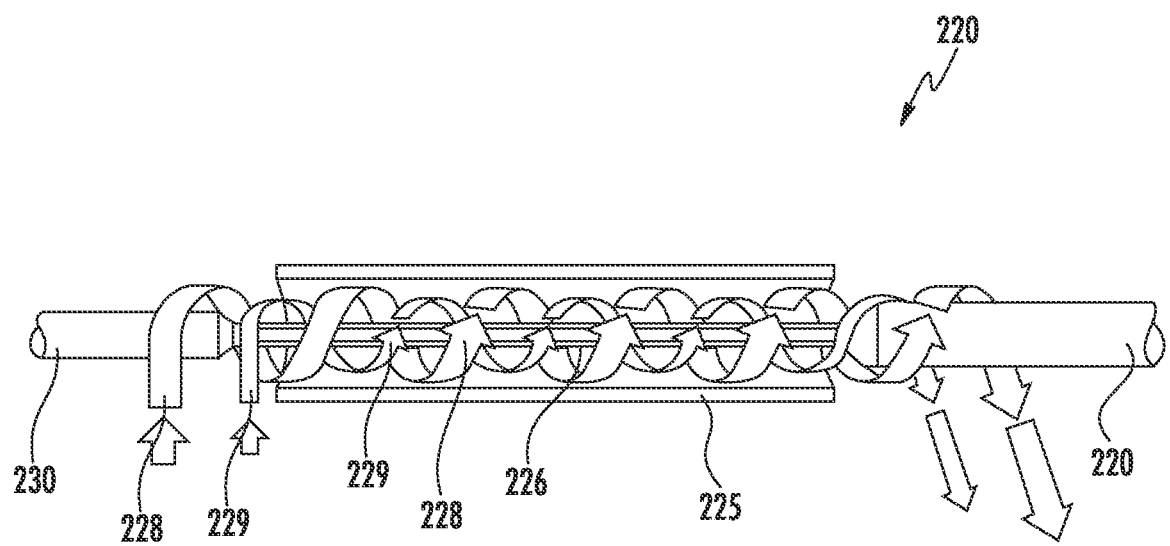
FIGS. 9-10 depict the operation of an example arc lamp according to example embodiments of the present disclosure.

FIGS. 8-11 depict aspects of example upper arc lamps 220 that can be used as light sources for intense millisecond long exposure of the top surface of the semiconductor substrate 60 (e.g., the "flash"). For instance, FIG. 8 depicts a cross-sectional view of an example arc lamp 220. The arc lamp 220 can be, for instance, an open flow arc lamp, where pressurized Argon gas (or other suitable gas) is converted into a high pressure plasma during an arc discharge. The arc discharge takes place in a quartz tube 225 between a negatively charged cathode 222 and a spaced apart positively charged anode 230 (e.g., spaced about 300 mm apart). As soon as the voltage between the cathode 222 and the anode 230 reaches a breakdown voltage of Argon (e.g., about 30 kV) or other suitable gas, a stable, low inductive plasma is formed which emits light in the visible and UV range of the electromagnetic spectrum. As shown in FIG. 9, the lamp can include a lamp reflector 262 that can be used to reflect light provided by the lamp for processing of the semiconductor substrate 60.

Figure 10:
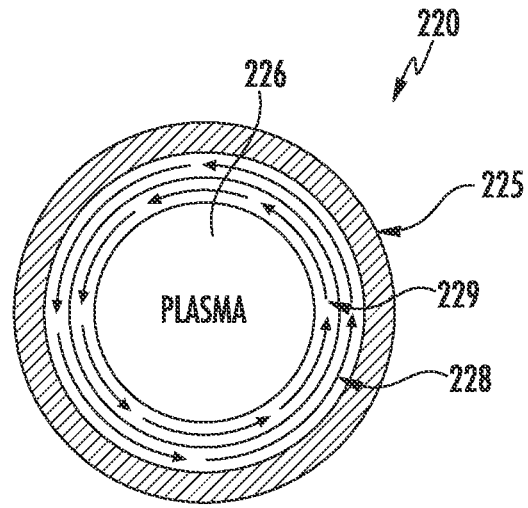
Figure 11:
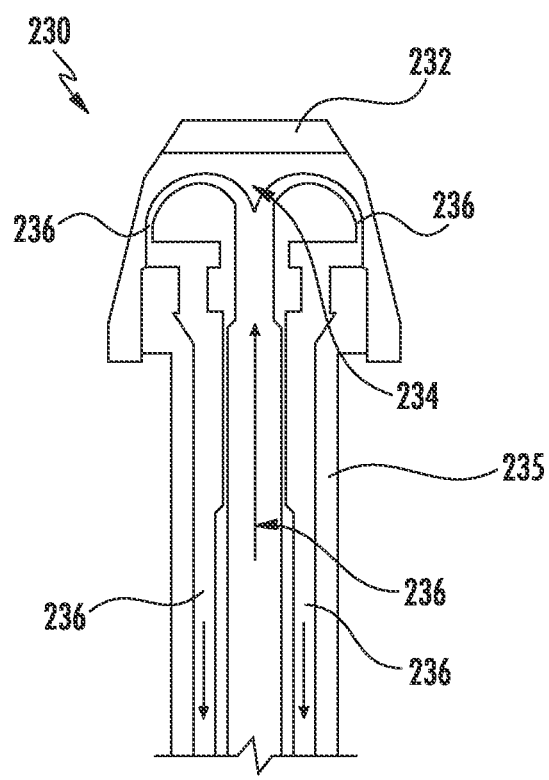
FIG. 11 depicts a cross-sectional view of an example electrode according to example embodiments of the present disclosure.

FIGS. 10 and 11 depict aspects of example operation of an arc lamp 220 in millisecond anneal system 80 according to example embodiments of the present disclosure. More particularly, a plasma 226 is contained within a quartz tube 225 which is water cooled from the inside by a water wall 228. The water wall 228 is injected at high flow rates on the cathode end of the lamp 200 and exhausted at the anode end. The same is true for the Argon gas 229, which is also entering the lamp 220 at the cathode end and exhausted from the anode end. The water forming the water wall 228 is injected perpendicular to the lamp axis such that the centrifugal action generates a water vortex. Hence, along the center line of the lamp a channel is formed for the Argon gas 229. The Argon gas column 229 is rotating in the same direction as the water wall 228. Once a plasma 226 has formed, the water wall 228 is protecting the quartz tube 225 and confining the plasma 226 to the center axis. Only the water wall 228 and the electrodes (cathode 230 and anode 222) are in direct contact with the high energy plasma 226.

FIG. 11 depicts a cross sectional view of an example electrode (e.g., cathode 230) used in conjunction with an arc lamp according to example embodiments of the present disclosure. FIG. 11 depicts a cathode 230. However, a similar construction can be used for the anode 222.

In some embodiments, as the electrodes experience a high heat load, one or more of the electrodes can each include a tip 232. The tip can be made from tungsten. The tip can be coupled to and/or fused to a water cooled copper heat sink 234. The copper heat sink 234 can include at least a portion the internal cooling system of the electrodes (e.g., one or more water cooling channels 236. The electrodes can further include a brass base 235 with water cooling channels 236 to provide for the circulation of water or other fluid and the cooling of the electrodes.

The arc lamps used in example millisecond anneal systems according to aspects of the present disclosure can be an open flow system for water and Argon gas. However, for conservation reasons, both media can be circulated in a close loop system in some embodiments.

Figure 12:
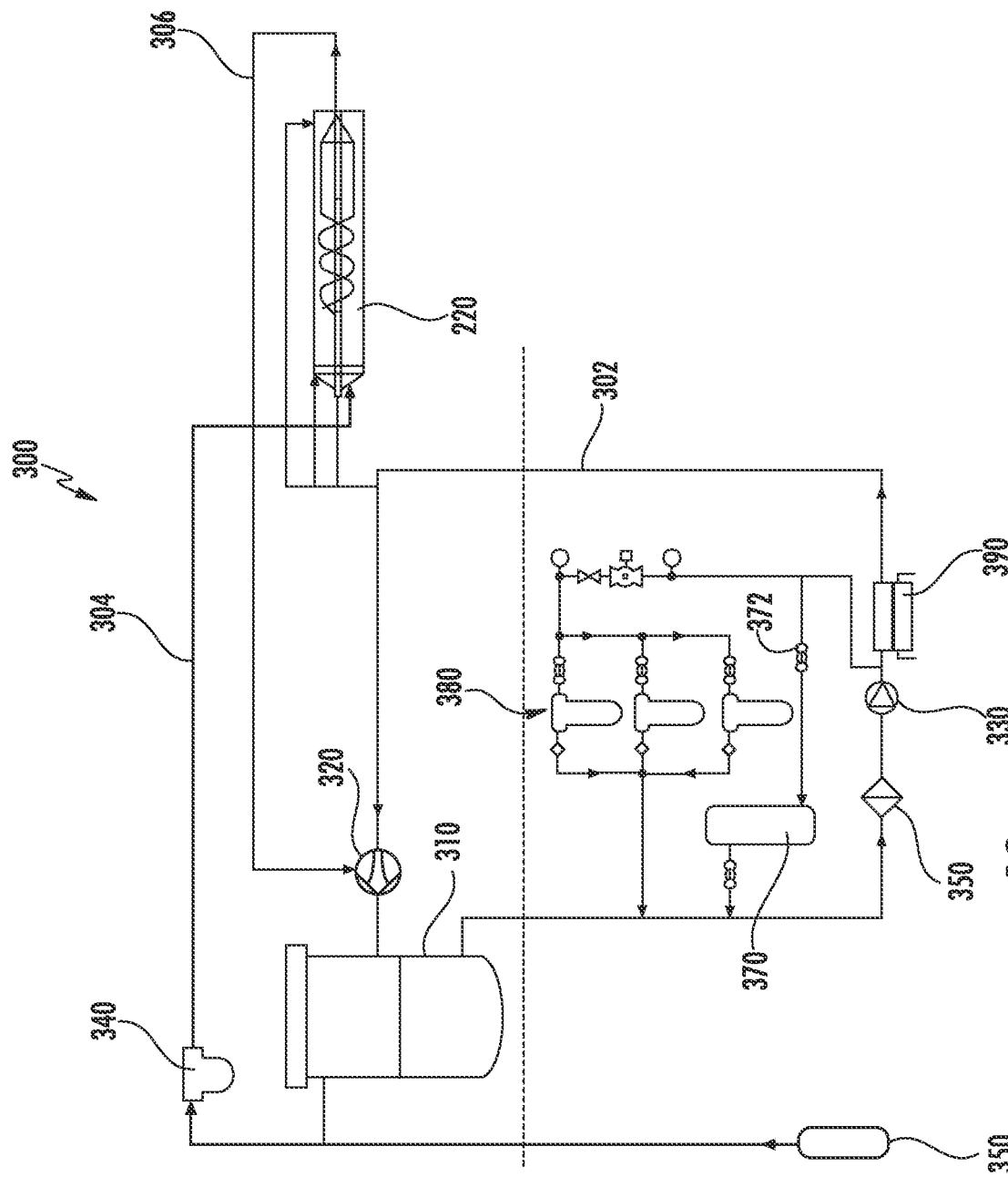
FIG. 12 depicts an example closed loop system for supplying water and gas (e.g., Argon gas) to example arc lamps used in a millisecond anneal system according to example embodiments of the present disclosure.

FIG. 12 depicts an example closed loop system 300 for supplying water and Argon gas needed to operate the open flow Argon arc lamps used in millisecond anneal systems according to example embodiments of the present disclosure.

More particularly, high purity water 302 and Argon 304 is fed to the lamp 220. The high purity water 302 is used for the water wall and the cooling of the electrodes. Leaving the lamp is a gas/water mixture 306. This water/gas mixture 306 is separated into gas free water 302 and dry Argon 304 by separator 310 before it can be re-fed to the inlets of the lamp 220. To generate the required pressure drop across the lamp 220, the gas/water mixture 306 is pumped by means of a water driven jet pump 320.

A high power electric pump 330 supplies the water pressure to drive the water wall in the lamp 220, the cooling water for the lamp electrodes, and the motive flow for the jet pump 320. The separator 310 downstream to the jet pump 320 can be used extracting the liquid and the gaseous phase from the mixture (Argon). Argon is further dried in a coalescing filter 340 before it re-enters the lam 220. Additional Argon can be supplied from Argon source 350 if needed.

The water is passing through one or more particle filters 350 to remove particles sputtered into the water by the arc. Ionic contaminations are removed by ion exchange resins. A portion of water is run through mixed bed ion exchange filters 370. The inlet valve 372 to the ion exchange bypass 370 can be controlled by the water resistivity. If the water resistivity drops below a lower value the valve 372 is opened, when it reaches an upper value the valve 372 is closed. The system can contain an activated carbon filter bypass loop 380 where a portion of the water can be additionally filtered to remove organic contaminations. To maintain the water temperature, the water can pass through a heat exchanger 390.

Figure 13:
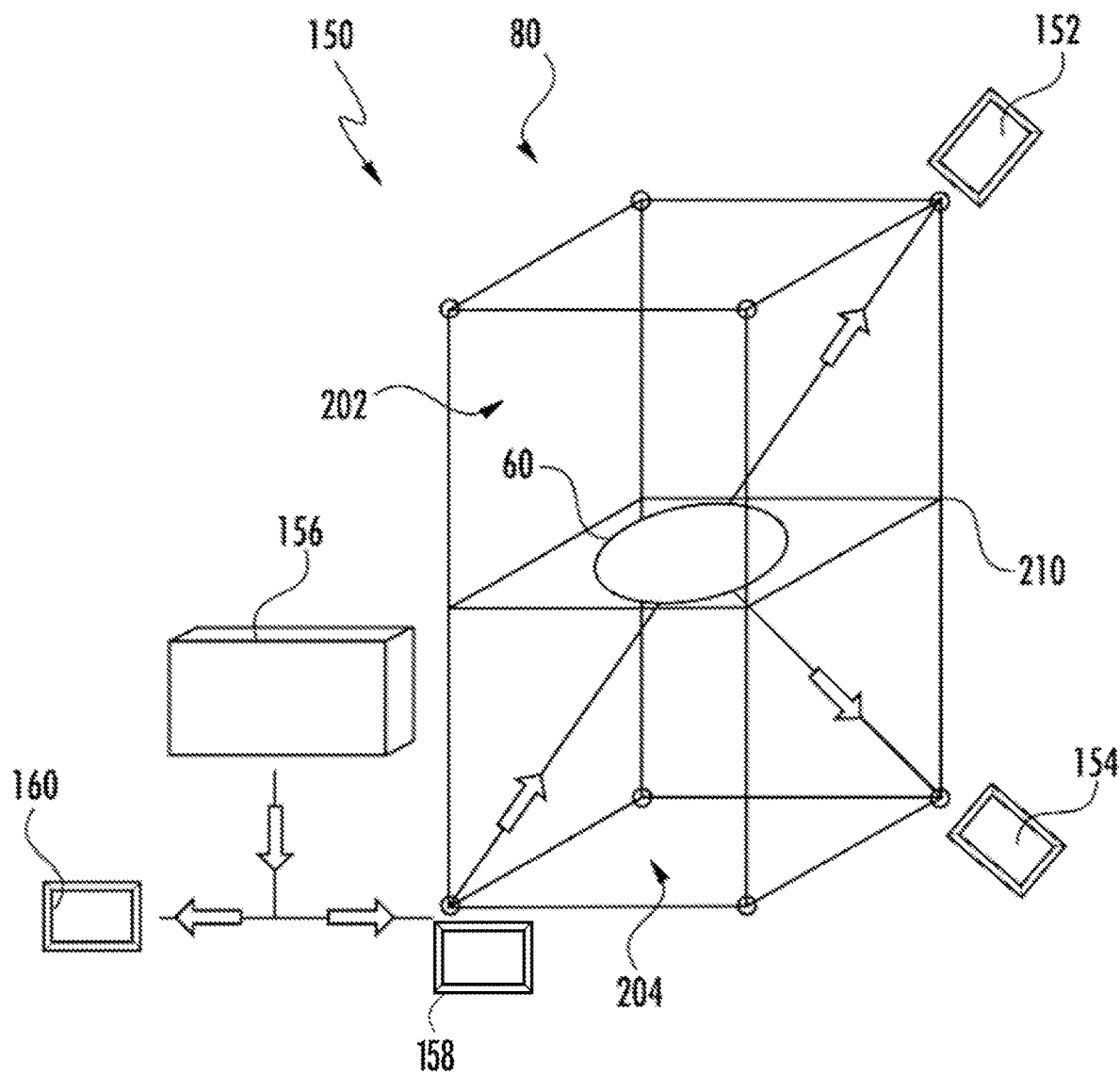
FIG. 13 depicts an example temperature measurement system for a millisecond anneal system according to example embodiments of the present disclosure.

Millisecond anneal systems according to example embodiments of the present disclosure can include the ability to independently measure temperature of both surfaces (e.g., the top and bottom surfaces) of the semiconductor substrate. FIG. 13 depicts an example temperature measurement system 150 for millisecond anneal system 200.

A simplified representation of the millisecond anneal system 200 is shown in FIG. 13. The temperature of both sides of a semiconductor substrate 60 can be measured independently by temperature sensors, such as temperature sensor 152 and temperature sensor 154. Temperature sensor 152 can measure a temperature of a top surface of the semiconductor substrate 60. Temperature sensor 154 can measure a bottom surface of the semiconductor substrate 60. In some embodiments, narrow band pyrometric sensors with a measurement wavelength of about 1400 nm can be used as temperature sensors 152 and/or 154 to measure the temperature of, for instance, a center region of the semiconductor substrate 60. In some embodiments, the temperature sensors 152 and 154 can be ultra-fast radiometers (UFR) that have a sampling rate that is high enough to resolve the millisecond temperature spike cause by the flash heating.

The readings of the temperature sensors 152 and 154 can be emissivity compensated. As shown in FIG. 13, the emissivity compensation scheme can include a diagnostic flash 156, a reference temperature sensor 158, and the temperature sensors 152 and 154 configured to measure the top and bottom surface of the semiconductor wafers. Diagnostic heating and measurements can be used with the diagnostic flash 156 (e.g., a test flash). Measurements from reference temperature sensor 158 can be used for emissivity compensation of temperature sensors 152 and 154

In some embodiments, the millisecond anneal system 200 can include water windows. The water windows can provide an optical filter that suppresses lamp radiation in the measurement band of the temperature sensors 152 and 154 so that the temperature sensors 152 and 154 only measure radiation from the semiconductor substrate.

The readings of the temperature sensors 152 and 154 can be provided to a processor circuit 160. The processor circuit 160 can be located within a housing of the millisecond anneal system 200, although alternatively, the processor circuit 160 may be located remotely from the millisecond anneal system 200. The various functions described herein may be performed by a single processor circuit if desired, or by other combinations of local and/or remote processor circuits.

Figure 16:
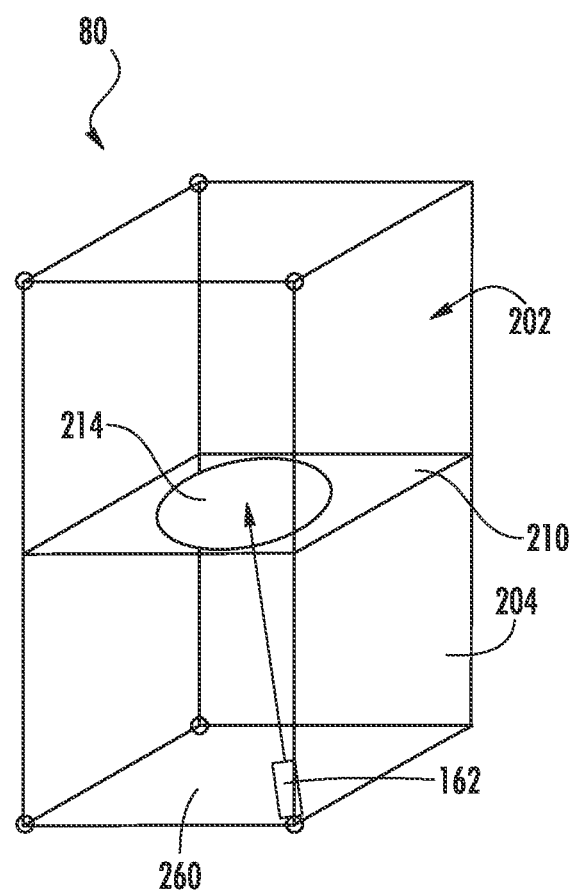
FIG. 16 depicts an example processing chamber having a pyrometer temperature sensor configured to determine the temperature of the wafer support plate according to example embodiments of the present disclosure.
Figure 22:
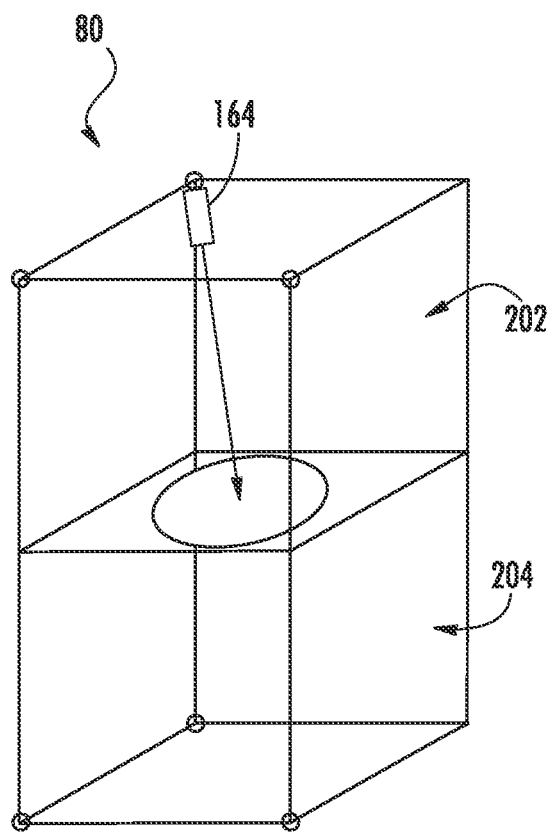
FIG. 22 depicts an example millisecond anneal system having a far infrared temperature sensor according to example embodiments of the present disclosure.

As will be discussed in detail below, the temperature measurement system can include other temperature sensors, such as a temperature sensor configured to obtain one or more temperature measurements of a wafer support plate (e.g., as shown in FIG. 16) and/or a far infrared temperature sensor (e.g., as shown in FIG. 22) configured to obtain one or more temperature measurements of a semiconductor substrate at temperatures below, for instance, about 450° C., such as less than about 300° C., such as less than about 250° C. The processor circuit 160 can be configured to process measurements obtained from the temperature sensors to determine a temperature of the semiconductor substrate and/or the wafer support plate.

Figure 14:
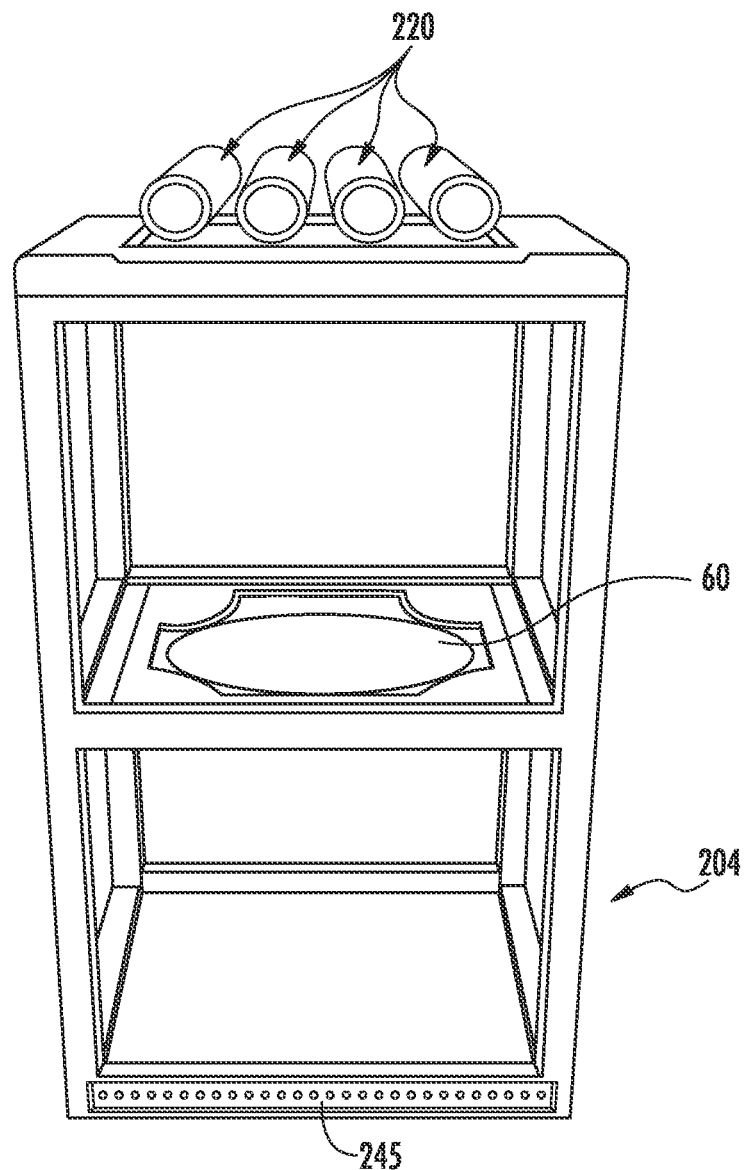
FIG. 14 depicts an example millisecond anneal system with tungsten halogen lamps for heating the semiconductor substrate to an intermediate temperature according to example embodiments of the present disclosure.

An alternative source for heating the semiconductor substrate to an intermediate temperature $T_i$ can be an array of tungsten halogen lamps located in the bottom processing chamber. For instance, two continuous mode arc lamps can each have each an electrical power of 125 kW for a total power of 250 kW. An array of 40 tungsten halogen lamps with 6 kW each can provide the same power. FIG. 14 depicts an example millisecond anneal system with tungsten halogen lamps 245 for heating the semiconductor substrate 60 to the intermediate temperature $T_i$. An advantage of heating with halogen lamps is an economical one. Tungsten halogen lamps can be less expensive and can have a much longer lifetime. Also the tungsten halogen lamps can only require electrical connections, omitting the need for expensive water cooling and water treatment units.

Example Preheat Processes for Chamber Pre-Conditioning

According to example aspects of the present disclosure, the time and the number of preheat dummy wafers needed to preheat the chamber can be reduced through use of a wafer support plate temperature measurement system to determine when the equilibrium temperature has been reached. For example, in some embodiments, the wafer support plate can be heated by applying heat to a dummy wafer with a special preheat recipe. As soon as the wafer support plate temperature a desired temperature, the preheat recipe execution can be stopped and the process recipe execution with the first device wafer in the wafer lot can commence.

Figure 15:
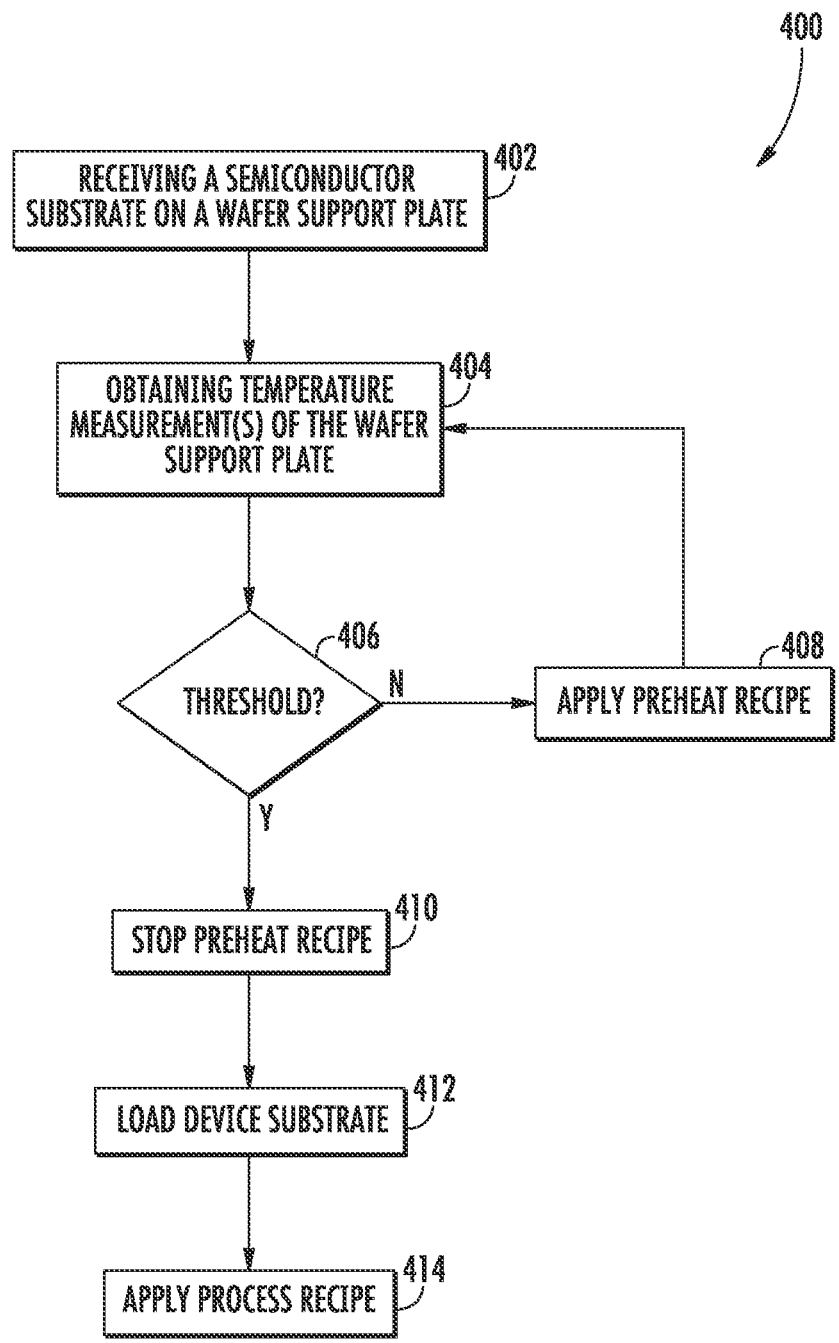
FIG. 15 depicts a flow diagram of an example process according to example embodiments of the present disclosure.

FIG. 15 depicts a flow diagram of an example process (400) according to example embodiments of the present disclosure. The process (400) can be implemented in a millisecond anneal system, such as one of the example millisecond anneal systems discussed with reference to FIGS. 1-14. FIG. 15 depicts steps performed in a particular order for purposes of illustration and discussion. Those of ordinary skill in the art, using the disclosures provided herein, will understand that various steps of any of the methods or processes described herein can be modified, adapted, expanded, omitted, and/or rearranged in various ways without deviating from the scope of the present disclosure.

At (402), the method includes receiving a semiconductor substrate on a wafer support plate in a processing chamber of a millisecond anneal system. For instance, a dummy wafer can be received on wafer support plate 214 in the process chamber 200 illustrated in FIGS. 2-4. The semiconductor substrate can be supported by support pins. The wafer support plate can be made from a quartz material. For instance, the wafer support plate can be a quartz glass plate.

At (404), the process can include obtaining one or more temperature measurements of the wafer support plate using a temperature sensor. FIG. 16 depicts an example processing chamber 80 having a temperature sensor 162 (e.g., a quartz pyrometer) configured to determine the temperature of the wafer support plate 214 according to example embodiments of the present disclosure. As illustrated, the temperature sensor 162 is mounted on the bottom of the process chamber in one of the corners of the bottom chamber 204, such that the field of view of the temperature sensor 162 is unobstructed by the semiconductor substrate 60 and the water window 260. In some embodiments, the temperature sensor 162 can be directed to the center of the wafer support plate 214.

Figure 17:
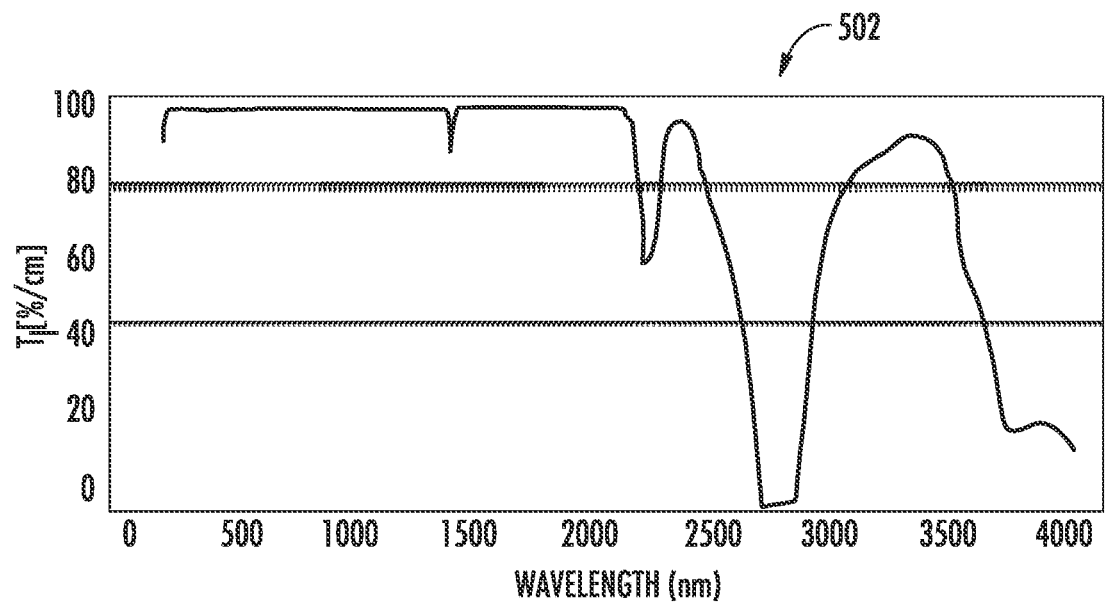
FIG. 17 depicts a typical thermal emission spectrum associated with wafer support plate made from quartz.
Figure 18:
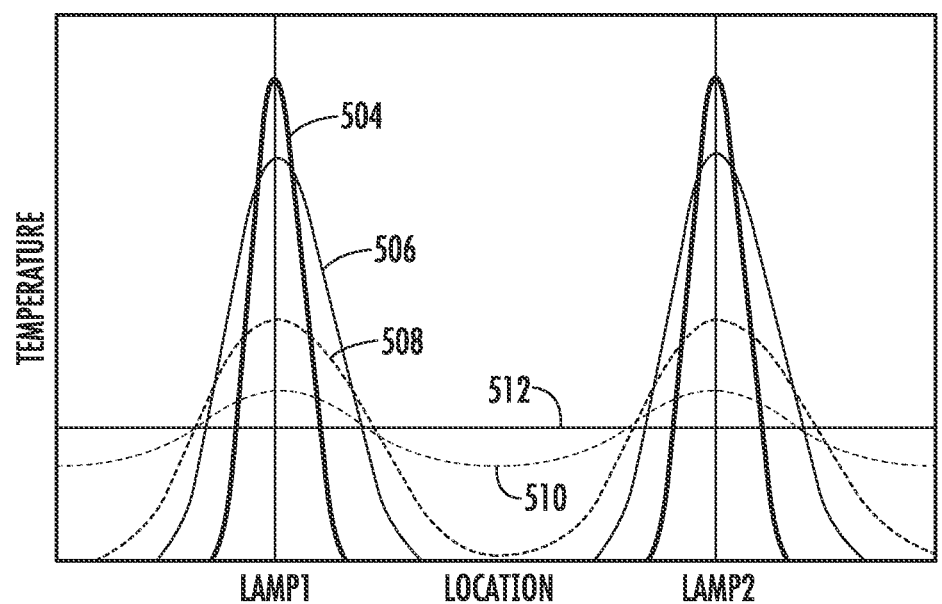
FIG. 18 depicts a graphical representation of the wafer support plate temperature distribution by relaxation according to example embodiments of the present disclosure.

In some embodiments, the temperature sensor 162 can be a pyrometer with a measurement wavelength beyond the transmission cut-off (e.g., greater than about 4 µm) of quartz. For instance, FIG. 17 depicts a typical thermal emission spectrum 502 associated with wafer support plate made from quartz. As shown, beyond about 4 µm, the quartz of the support plate is opaque and emits thermal radiation. The thermal radiation can be measured pyrometrically by the temperature sensor 162 to determine the temperature of the wafer support plate.

At (406) of FIG. 15, the process can include determining whether a temperature of the wafer support plate has reached a threshold temperature (e.g., pre-set temperature). The threshold temperature can be associated with an equilibrium temperature of the wafer support plate. If the temperature of the wafer support plate has not reached the threshold temperature (e.g., is not greater than or equal to the threshold temperature), the process (400) can include applying a preheat recipe to heat the wafer support plate and the semiconductor substrate (e.g., the dummy wafer) as shown at (408) of FIG. 15. In some embodiments, a preheat recipe can use only the continuous mode lamps to heat a dummy wafer placed on the wafer support plate. In some embodiments, the lamps can be operated in closed loop control, with the semiconductor substrate temperature and/or the wafer support plate temperature as control input.

In some embodiments, the heating cycle of the pre-recipe can include one or more combinations of soak and spike wafer temperature set-points, as well as flash heating using the flash lamps. In some embodiments, the heating cycle does not use a closed loop mode. Rather the continuous mode lamps are operated at a fixed power value in an open loop fashion. In some embodiments, the heating cycle of the preheat recipe includes a cool-down phase before a heating phase to improve the start temperature consistency and thus to improve the repeatability of the pre-conditioning.

In the event the temperature of the wafer support plate has reached the threshold temperature, the process (400) can include stopping the preheat recipe (410). The process (400) can then include loading a device semiconductor substrate (412) for processing and applying a process recipe to thermally treat the semiconductor substrate (414). The process recipe can be different from the preheat recipe and can include a recipe for processing a device semiconductor substrate from a lot of semiconductor substrates.

Example Dummy Wafer Free Preheat Processes

According to example aspects of the present disclosure, a preheat process can be implemented that does not require preheat dummy wafers. The wafer support plate can be made out of quartz, which, by its optical properties, is not easily heated by light. In a millisecond anneal system according to example embodiments of the present disclosure, arc lamps (e.g., Argon arc lamps) can be used for processing semiconductor substrates. The lamp radiation emitted from the lamps can predominantly include light at a wavelength shorter than 1.5 µm, which is the wavelength range transmitted by the water window. In other rapid thermal processing systems, the light sources can be tungsten halogen lamps at about 3000K, where the peak of the spectrum is at about 1 µm. Quartz glass can be transparent to light up to about 2 µm with a transmission coefficient of greater than about 90%. As a result, the heating rate of the wafer support plate by direct absorption of lamp light from the arc lamps is small.

In preheat processes using preheat dummy wafers, such as the process depicted in FIG. 15, this difficulty can be avoided. In these example embodiments, lamp light is used to predominantly heat the semiconductor substrate, which is a good absorber for the lamp light in the UV up to the near infra-red regime (e.g., about 0.2 µm to about 1 µm). Since the dummy wafer is re-emitting light in a wavelength range determined by its temperature (Planck's law), the short-wavelength light of the heating source is converted to a long-wavelength range. For instance, a semiconductor substrate at 1000° C. emits nearly all of its radiation in a wavelength range of greater than about 2 µm, which is readily absorbed by the quartz material. The quartz wafer support plate is therefore heated indirectly by the secondary radiation stemming from the semiconductor substrate.

According to example embodiments of the present disclosure, a method of heating the highly transparent quartz of the wafer support plate by light without requiring the presence of semiconductor substrates is provided. The process can make use of the same principles as the process of FIG. 15. For instance, the wafer support plate temperature is measured by, for instance, a quartz pyrometer sensor. A preheat recipe can be applied until a temperature of the wafer support plate reaches a threshold temperature (e.g., a temperature associated with an equilibrium temperature of the wafer support plate).

In systems where the heating sources are halogen lamps, the sensor signal contains not only radiation coming from the wafer support plate, but also contains radiation from the light source itself. The wafer support plate temperature can therefore only be measured accurately when the lamps are off.

In some applications, small pieces of silicon are part of the chamber. These small pieces of silicon remain inside the chamber even when there is no semiconductor substrate in the chamber. Other than the quartz material of the wafer support plate, these pieces of silicon are good absorbers of lamp light, are not actively cooled, and therefore can quickly reach a melting point temperature. The same is true for every other material with a higher absorption rate of lamp light and a lower melting point as quartz (e.g., rubber gaskets). Therefore, the maximally allowable heating power can be determined by the material inside the chamber.

An additional difficulty of directly heating the quartz plate is that the thermal conduction of quartz is very small. Hence the temperature distribution of the quartz plate, when heated without a semiconductor substrate is different from the stationary case with the semiconductor substrate. The temperature distribution predominately assumes the shape of the heating source. In cases of the secondary heating via the semiconductor substrate, this is a circular pattern. In cases of direct heating via linear heating sources (e.g., arc lamps and tungsten halogen lamps) this is a striped pattern.

Figure 19:
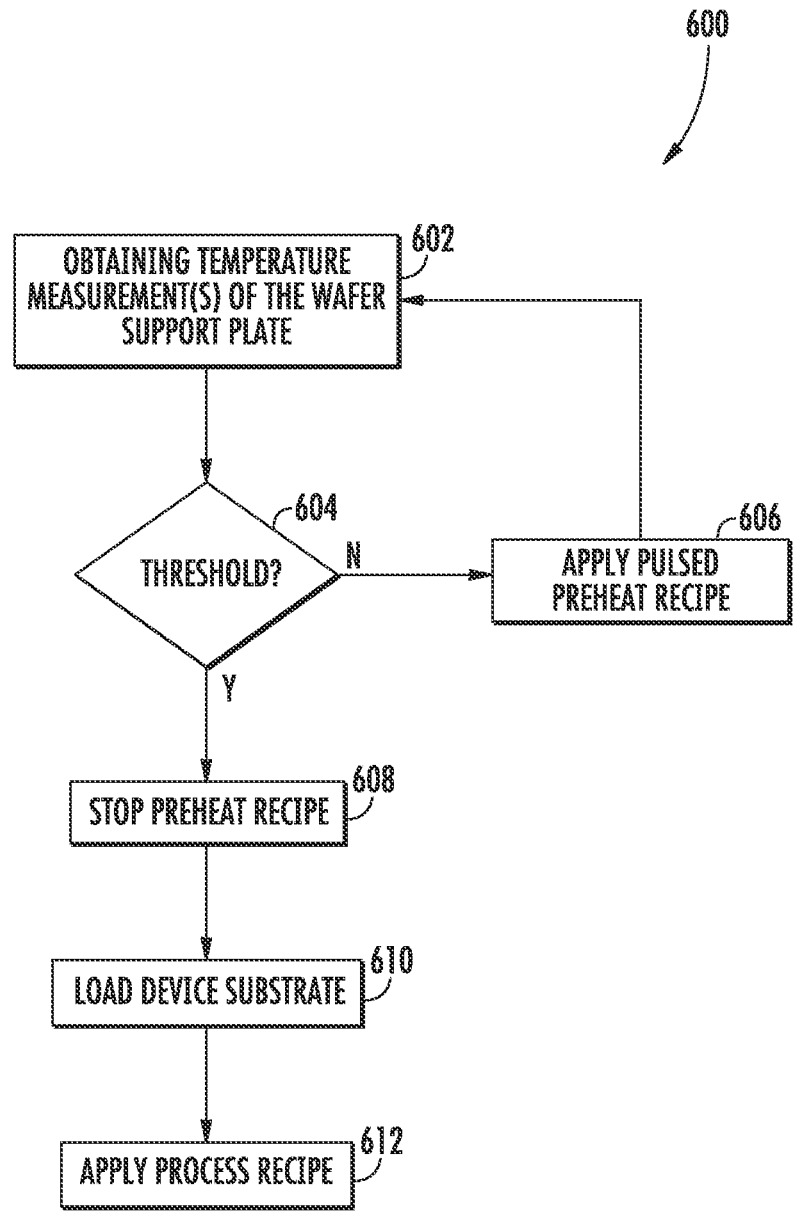
FIG. 19 depicts a flow diagram of an example process according to example embodiments of the present disclosure.

A preheat process according to example aspects of the present disclosure can overcome this difficulty by using a relaxation by cooldown by which the temperature distribution is evened out over time. For instance, FIG. 19 depicts a graphical representation of the wafer support plate temperature distribution by relaxation. As shown, by thermal conduction, a striped thermal pattern formed by an array of lamps is averaged out during cool down of the wafer support plate. More particularly, curve 504 represents temperature of the wafer support plate as a function of location on the wafer support plate at a first time t1. Curve 506 represents temperature of the wafer support plate as a function of location on the wafer support plate at a second time t2. Curve 506 represents temperature of the wafer support plate as a function of location on the wafer support plate at a third time t3. Curve 508 represents temperature of the wafer support plate as a function of location on the wafer support plate at a third time t4. As shown, as time passes from t1 to t4, the temperature distribution of the wafer support plate approaches an average temperature 512 across the wafer support plate.

The time needed for the temperature distribution to even out is governed by the thermal conductivity of the material and the temperature difference. This can be seen in Fourier's law of heat conduction (for simplistic reasons in the one-dimensional form):

$$q_x = -k\frac{dT}{dx}$$

$Q_x$: heat flux density
k: thermal conductivity of the material
dT/dx: temperature gradient Heating the transparent quartz material of the wafer support plate can be based on an isothermal chamber. In equilibrium, the substrate to be heated assumes the temperature of the walls of the isothermal chamber, and the temperature distribution can be uniform. In a first-order approximation, the millisecond anneal system according to example embodiments of the present disclosure can be an isothermal chamber due to the high reflective chamber walls. Given a long enough time, any material, regardless of its optical properties, will assume the temperature of the heating source. In other words, since the heating light is trapped in the reflecting box of the chamber, there are numerous passes through the wafer support plate, each pass absorbing, for instance, 10% of the light. Eventually all light is being absorbed and the wafer support plate is reaching the equilibrium temperature. In an empty processing chamber with no semiconductor substrate to be processed, a dominant absorber can be the quartz of the wafer support plate.

Example aspects of the present disclosure are directed to shortening the time needed to reach equilibrium temperature to a few minutes. To achieve this, the lamps can be operated in a pulsed manner. The heating power of each pulse can be much higher than the heating power necessary to reach the equilibrium temperature in the un-pulsed case (over-heating). In between heating pulses the temperature distribution can relax by thermal diffusion. Since the thermal gradient is high, the time needed for relaxation is much shorter than in the un-pulsed case. After a number of pulses, the wafer support plate can reach an average, uniform temperature.

FIG. 19 depicts a flow diagram of an example process (600) according to example embodiments of the present disclosure. The process (600) can be implemented in a millisecond anneal system, such as one of the example millisecond anneal systems discussed with reference to FIGS. 1-14. FIG. 19 depicts steps performed in a particular order for purposes of illustration and discussion. Those of ordinary skill in the art, using the disclosures provided herein, will understand that various steps of any of the methods or processes described herein can be modified, adapted, expanded, omitted, and/or rearranged in various ways without deviating from the scope of the present disclosure. The process (600) can be performed without a semiconductor substrate located on the wafer support plate.

At (602), the process can include obtaining one or more temperature measurements of the wafer support plate using a temperature sensor. For instance, temperature measurements of the wafer support plate can be obtained from the temperature sensor 162 of FIG. 16.

At (604) of FIG. 19, the process can include determining whether a temperature of the wafer support plate has reached a threshold temperature (e.g., pre-set temperature). The threshold temperature can be associated with an equilibrium temperature of the wafer support plate. If the temperature of the wafer support plate has not reached the threshold temperature (e.g., is not greater than or equal to the threshold temperature), the process (600) can include applying a pulsed preheat recipe to heat the wafer support plate as shown at (606) of FIG. 19.

Figure 20:
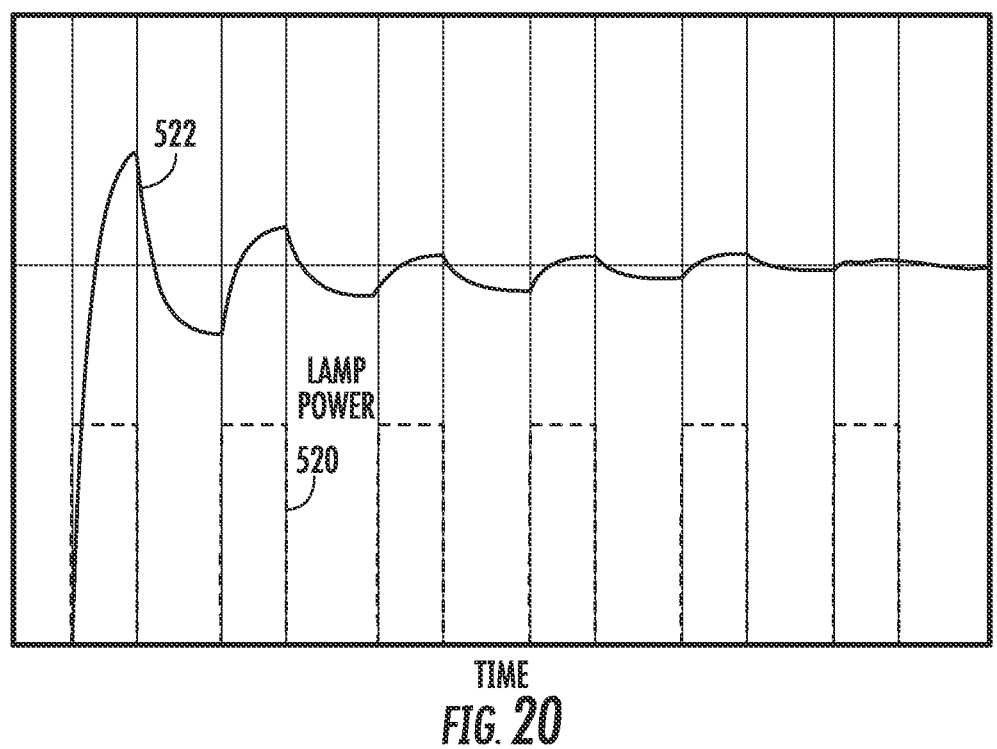
FIG. 20 depicts an example pulsed preheat recipe according to example embodiments of the present disclosure.
Figure 21:
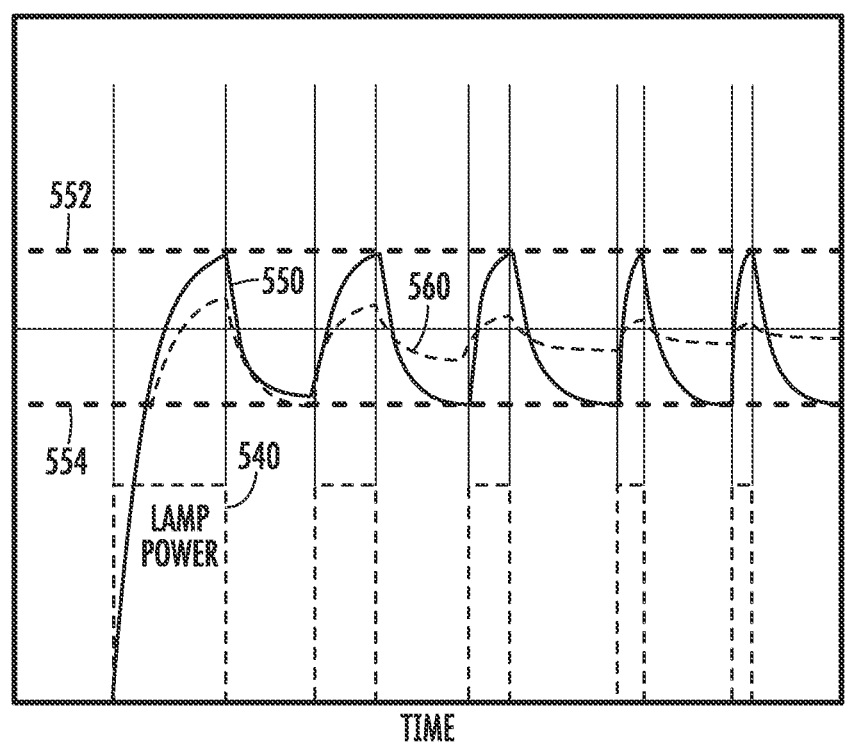
FIG. 21 depicts an example pulsed preheat recipe according to example embodiments of the present disclosure.

FIG. 20 depicts a graphical representation of example pulsed preheat recipe to accelerate the time needed for the wafer support plate to reach equilibrium temperature and uniform temperature distribution. More particularly, curve 520 represents pulsed heating of lamps to implement the pulsed preheat recipe according to example aspects of the present disclosure. Curve 522 represents the temperature of the wafer support plate in response to pulsed heating of lamps. In some example embodiments, the heating power of the pulses is such that the heat load specification of the chamber is not exceeded. The number of pulses can be between 10 and 100 and the total time of the preheat cycle is 3 to 4 minutes.

In some embodiments, the pulsed heating can be controlled based at least in part on temperature measurements by a temperature sensor (e.g., pyrometer) configured to measure the temperature of the wafer support plate. As the temperature sensor signal is also affected by the lamp light and is only measuring a small region on the wafer support plate, the temperature sensor signal may not be equal to the average wafer plate temperature. In some embodiments, the lamp power is switched off when the temperature sensor signal reaches an upper limit and is switched on when the quartz pyrometer reaches a lower limit.

For instance, FIG. 20 depicts the example pulsed preheating of a wafer support plate based on temperature measurements of the wafer support plate by a temperature sensor according to example embodiments of the present disclosure. Curve 540 represents pulsed heating of lamps to implement the pulsed preheat recipe according to example aspects of the present disclosure. As illustrated, if the signal 550 from the temperature sensor reaches an upper limit 552, the pulsed heating is turned off. When the signal 550 from the temperature sensor reaches a lower limit 554, the pulsed heating is turned on. After several cycles, an average temperature represented by curve 560 that is generally uniform across the wafer support plate is achieved.

In some embodiments, the time to reach equilibrium temperature can be shortened by "over-heating" with constant power and shutting off when the temperature sensor signal reaches a target temperature. The pulsed over-heating method can have several advantages over the non-pulsed over-heating. For instance, the average temperature can be independent of the duration of the preheat cycle or the number of pulses. In addition, the pulsed preheat method can also work in cases where the quartz temperature sensor signal is compromised by parasitic signals.

Referring to FIG. 19, in the event the temperature of the wafer support plate has reached the threshold temperature, the process (600) can include stopping the preheat recipe (610). The process (600) can then include loading a device semiconductor substrate (612) for processing and applying a process recipe to thermally treat the semiconductor substrate (614). The process recipe can be different from the preheat recipe and can include a recipe for processing a device semiconductor substrate from a lot of semiconductor substrates.

Example Low Temperature Control Using Temperature Sensor Measurements of Wafer Support Plate Another example aspect of the present disclosure is directed to reducing a minimum intermediate temperature at which the millisecond anneal system can operate by using a temperature sensor in the far infrared. As discussed above, typical temperature sensors used to measure the temperature of a semiconductor substrate during thermal processing include UFRs. UFRs typically use a wavelength of 1.45 μm to determine the temperature of the semiconductor substrate. At this wavelength, lightly doped silicon is transparent below about 450° C. Accordingly, UFR temperature sensors cannot be used for measuring temperatures below 450° C.

According to example embodiments of the present disclosure, a far infrared temperature sensor (e.g., quartz pyrometer temperature sensor) can be used to measure the temperature of the semiconductor substrate. The sensor can have a spectral range in the far infrared of about 8 μm to about 14 μm, which is in a range where the emissivity of silicon at low temperatures is non-zero and a radiation signal can be picked up.

In some embodiments, the far-infrared temperature sensor can be mounted in one of the corners in a top chamber of the millisecond anneal system such that its field of view is not obstructed by a water window. For instance, FIG. 22 depicts an example location of a far-infrared temperature sensor 164 in a corner of a top chamber 202 of millisecond anneal system 80 according to example embodiments of the present disclosure. The temperature sensor 164 can have a field of view of the substrate 60 mounted in the processing chamber without obstruction by a water window.

In some embodiments, a sensor mounted on the bottom half chamber and is directly measuring the temperature the wafer support plate, which is thermally coupled to the silicon wafer. An advantage of measuring the wafer support plate rather than the semiconductor substrate directly is that the wafer emissivity is dependent on the device pattern and can vary, whereas the emissivity of the quartz wafer support plate is constant.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A temperature measurement system for a millisecond anneal system, the system comprising:
   a first far infrared temperature sensor configured to obtain one or more temperature measurements of a substrate in the millisecond anneal system at process temperatures of less than about 450° C., the millisecond anneal system comprising a processing chamber having a wafer plane plate, the wafer plane plate dividing the processing chamber into a top chamber and a bottom chamber, wherein the first far infrared temperature sensor comprises a pyrometer associated with a spectral range of about 8 μm to about 14 μm, the pyrometer being configured to obtain temperature measurements of the substrate at temperatures below 450° C.;
   a second far infrared temperature sensor configured to obtain one or more temperature measurements of the substrate in the millisecond anneal system at process temperatures of less than about 450° C., wherein the second far infrared temperature sensor comprises a pyrometer associated with a spectral range of about 8 μm to about 14 μm;
   a diagnostic flash and a reference temperature sensor, wherein measurements from the reference temperature sensor can be used for emissivity compensation of the first far infrared temperature sensor and/or the second far infrared temperature sensor; and a processing circuit configured to process measurements from the first far infrared temperature sensor, the second far infrared temperature sensor and/or the reference temperature sensor to determine a temperature of the substrate at temperatures of less than about 450° C.

2. The temperature measurement system of claim 1, wherein the first far infrared temperature sensor is unobstructed by a water window of the millisecond anneal system.

3. The temperature measurement system of claim 1, wherein a water window is disposed between the first far infrared temperature sensor and the wafer plane plate.

4. The temperature measurement system of claim 1, wherein a water window is disposed between the second far infrared temperature sensor and the wafer plane plate.

5. The temperature measurement system of claim 1, wherein the diagnostic flash and the reference temperature sensor are configured to measure a diagnostic temperature measurement based on the diagnostic flash.

6. The temperature measurement system of claim 5, wherein the processing circuit is configured to utilize the diagnostic temperature measurement for emissivity compensation for the first far infrared temperature sensor and/or the second far infrared temperature sensor.

7. The temperature measurement system of claim 1, comprising one or more temperature sensors configured to obtain temperature measurements of the wafer plane plate.

8. The temperature measurement system of claim 7, wherein the processing circuit is configured to utilize the temperature measurements of the wafer plane plate to determine the temperature of the substrate.

9. The temperature measurement system of claim 1, comprising edge reflectors disposed on the wafer plane plate.

10. The temperature measurement system of claim 9, wherein the processing circuit is configured to modify a reflectance of the edge reflectors based on the temperature of the substrate.

\* \* \* \* \*